United States Patent [19]

Ohtsu et al.

[11] Patent Number: 4,964,108
[45] Date of Patent: Oct. 16, 1990

[54] VOLUME CONTROL FOR SOUND REPRODUCING APPARATUS

[75] Inventors: Masahiro Ohtsu; Tohru Kurita, both of Kanagawa, Japan

[73] Assignee: Sony Corporation, Tokyo, Japan

[21] Appl. No.: 383,422

[22] Filed: Jul. 24, 1989

[30] Foreign Application Priority Data

Jul. 29, 1988 [JP] Japan .................. 63-189691
Jul. 29, 1988 [JP] Japan .................. 63-189692

[51] Int. Cl.$^5$ ............................................. G11B 31/00
[52] U.S. Cl. .................................... 369/19; 368/245; 368/10
[58] Field of Search .................. 368/11, 12, 245, 250, 368/261; 369/19–23

[56] References Cited

U.S. PATENT DOCUMENTS

| 4,047,377 | 9/1977 | Banks, Jr. | 368/12 |
| 4,451,796 | 5/1984 | Yasumura | 330/298 X |
| 4,481,674 | 11/1984 | Silva | 368/245 X |
| 4,879,699 | 11/1989 | Sakamoto | 368/245 |

FOREIGN PATENT DOCUMENTS 61-213788 9/1986 Japan ................... 368/245

Primary Examiner—Stuart S. Levy
Assistant Examiner—James E. Tomassini
Attorney, Agent, or Firm—Alvin Sinderbrand

[57] ABSTRACT

A sound reproducing apparatus is provided with an audio signal processing circuit for receiving an audio signal from a signal input circuit and applying the same to a speaker or sound producer through a variable resistor which is adjusted to vary its effective resistance value by an actuator operating in response to a drive signal so as to reproduce sound corresponding to the audio signal with a volume determined by the effective resistance value of the variable resistor, a time control for causing the audio signal processing circuit to commence operation automatically at a preset time, a duration setting arrangement operative in response to a duration setting signal to store in a memory data corresponding to a selected duration of operation of the actuator, and a controller programmed to be operative, when the time control causes the commencement of operation of the audio signal processing circuit at the preset time, to cause a signal generator to apply a drive signal to the actuator for the selected duration corresponding to the data stored in the memory so as to determine the volume of sound from the speaker at the end of such duration.

14 Claims, 5 Drawing Sheets

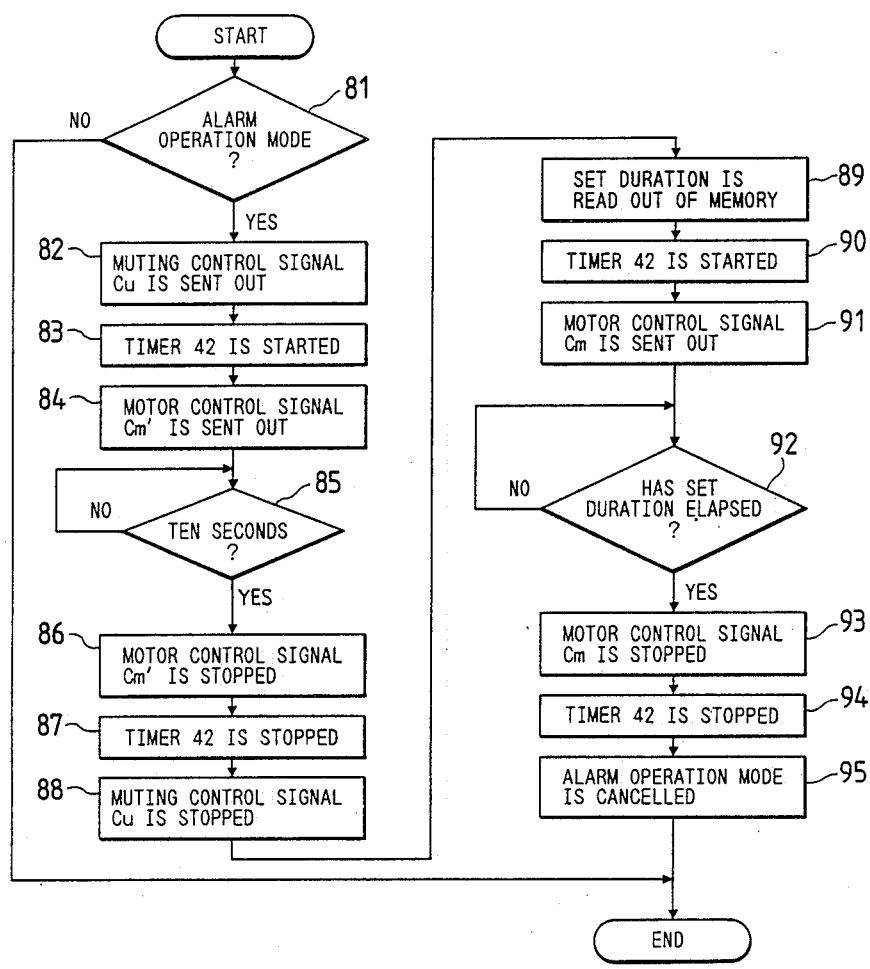

VOLUME CONTROL FOR SOUND REPRODUCING APPARATUS

BACKGROUND OF THE INVENTION

1. Field of the Invention

The present invention relates generally to sound reproducing apparatus and, more particularly, is directed to a sound reproducing apparatus which is automatically made operative at a preset time for reproducing sound with a selected volume.

2. Description of the Prior Art

Sound reproducing apparatus has been proposed for receiving an audio signal from a broadcast radio receiver, an audio disk of tape player or other audio signal source and for reproducing sound based on such audio signal, and wherein a time control is provided for automatically controlling the main power supply and other operating components of the sound reproducing apparatus to start and stop at predetermined or present times. Such known sound reproducing apparatus is further provided with a remote controller by which the main power supply can be activated and other operations can be made to start or stop in response to command signals issued from a remote location.

In the known sound reproducing apparatus provided with the time control and remote control functions described above, the volume of the sound reproduced it response to the time control or the remote controller is controlled by varying the effective resistance value of a variable resistor which, for example, is included in an audio amplifier of an audio signal processing circuit, and which is controlled by a volume control signal. The variable resistor for effecting volume control can be electronically controlled, for example, in the form of a semi-conductor resistive device with its variable resistance controlled directly by a control signal, or it can be a mechanically driven variable resistor in the form of a rotary or linearly slidable variable resistive device provided with an actuator, such as, an electric motor, which drives the rotary or linearly slidable variable resistive device in response to a control signal.

The above described known sound reproducing apparatus provided with time control and remote control functions may be employed as an alarm for waking a sleeping person, in which case the time control function commences operation of the audio signal processing circuit for producing the sound output at a preset time, and the variable resistor is employed for obtaining the reproduced sound with an appropriate volume, that is, loud enough to wake a sleeping person.

For causing the volume controlling variable resistor to operate so that an appropriate volume of the reproduced sound is obtained from the apparatus provided with both the time control and remote control functions when used as an alarm for waking a person, it is necessary to recognize or sense the condition of the volume controlling variable resistor when the preset time is being established, and also at such preset time, that is, when the variable resistor becomes operative for obtaining the desired volume control. When the volume controlling variable resistor is constituted by an electronically controlled semi conductor resistive device having its variable resistance controlled directly by a control signal, the recognition and estimate of the resistance value of the volume controlling variable resistor can be easily achieved, at any time, on the basis of the control signal which is applied to the semi-conductor resistive device.

On the other hand, when a mechanically driven rotary or linearly slidable variable resistor is used for achieving the volume control, it is necessary to provide a device for detecting positions of a slider of the variable resistive device for use in recognizing and estimating the effective resistance value of the volume controlling variable resistor. Such slider position detecting device produces a detection output signal corresponding to the position of the slider of the sliding variable resistive device, and hence to its effective resistance value, and a circuit arrangement including a waveform shaping circuit, an analog-to-digital converter, a pulse counter and so on, for processing the detection output signal. The foregoing arrangement is disadvantageous in that it undesirably increases the complexity and cost of the sound reproducing apparatus.

OBJECTS AND SUMMARY OF THE INVENTION

Accordingly, it is an object of the present invention to provide a sound reproducing apparatus having a mechanically driven variable resistor for effecting volume control in an audio signal processing circuit, and which avoids the previously mentioned disadvantages of the prior art.

More specifically, it is an object of this invention to provide a sound reproducing apparatus in which an audio signal processing circuit is made operative at a preset time and a variable resistor having a mechanically driven slider is provided in such circuit for controlling the volume of the reproduced sound which is thereby obtained with an appropriate volume without the need for employing a slider position detecting device in association with the mechanically driven variable resistor.

Another object of the invention is to provide a sound reproducing apparatus, as aforesaid, in which the mechanically driven variable resistor provided in the audio signal processing circuit for controlling the volume of the reproduced sound is surely and accurately operated at the preset time when operation of the sound reproducing apparatus is commenced, and in which such desirable characteristics of the apparatus are attained without unduly increasing the complexity and cost of the apparatus.

In accordance with an aspect of this invention, a sound reproducing apparatus is provided with a audio signal processing circuit for receiving an audio signal from an input circuit and applying the same to a speaker or sound producer through a variable resistor which is mechanically adjusted or driven to vary its effective resistance value by an actuator, such as, an electric motor, operating in response to a drive signal so as to reproduce sound corresponding to the audio signal with a volume determined by the effective resistance value of the variable resistor, a time control for causing the audio signal processing circuit to commence operation automatically at a preset time, duration setting means operative in response to a duration setting signal and having a memory in which data corresponding to a selected duration of operation of the actuator are stored, and control means programmed to be operative, when the time control causes the commencement of the operation of the audio signal processing circuit at the preset time, to apply the drive signal to the actuator for the selected duration corresponding to the data stored in the memory so as to determine the volume of the sound from the speaker or sound producer at the end of such selected duration.

In a preferred embodiment of the invention, the control means is further programmed to cause the variable resistor to have an effective resistance value at one end of its range of varying effective resistance values when the audio signal processing circuit is made to commence operation at the preset time, and only thereafter is the drive signal applied to the actuator for the selected duration for varying the effective resistance value of the variable resistor in the direction away from said one end of the range of effective resistance values. Thus, it is made certain that, upon each commencement of operation of the audio signal processing circuit, the application of the drive signal to the actuator for the selected duration will consistently result in a desired volume of the reproduced sound.

Consequently, in the sound reproducing apparatus embodying the present invention and in which the variable resistor provided for volume control is mechanically driven by an actuator, the sound reproduced subsequent to the preset time has its volume controlled automatically by the variable resistor so as to be at an appropriate high level without requiring detection of the condition of the variable resistor and, therefore, without requiring undue complication of the apparatus and an undesirable increase in its cost.

Further, since the variable resistor provided in the audio signal processing circuit for controlling the volume of the reproduced sound is driven by its associated actuator or motor so as to provide initially the effective resistance value at one end of its variable range of effective resistance values, and then to vary the effective resistance of the variable resistor in the direction away from that one end of the range to an extent determined by the duration for which the drive signal is applied to the actuator, it will be apparent that the sound volume subsequent to the preset time at which operation of the audio signal processing circuit is commenced is controlled automatically so as to be a constant value.

The above, and other objects, features and advantages of the present invention, will be apparent in the following detailed description of preferred embodiments when read in conjunction with the accompanying drawings, in which corresponding parts and components are identified by the same reference numerals in the several views.

BRIEF DESCRIPTION OF THE DRAWINGS

FIG. 5 is a flow chart showing a sequence of steps or operations performed by the apparatus of FIG. 4 under the control of a microcompter included therein when performing an alarm function of such apparatus.

DESCRIPTION OF THE PREFERRED EMBODIMENTS

Figure 1:
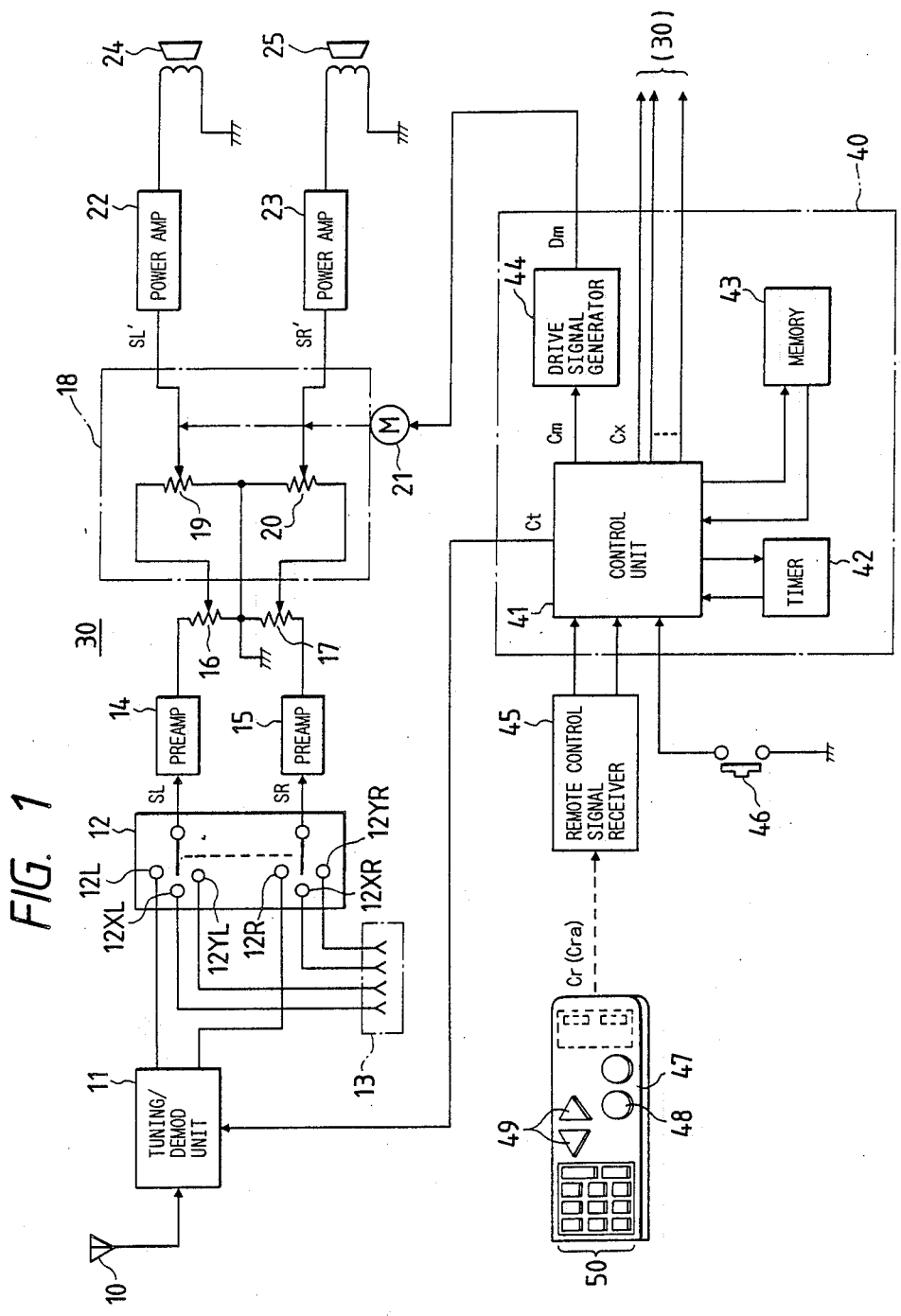
FIG. 1 is a schematic block diagram showing a sound reproducing apparatus according to an embodiment of the present invention.

Referring initially to FIG. 1, it will be seen that a sound reproducing apparatus according to an embodiment of the present invention is there shown to be in the form of a stereophonic broadcast signal receiver which includes a tuning and demodulating unit 11 connected to a signal receiving antenna 10. The tuning and demodulating unit 11 contains a conventional electronic tuning device for selecting a desired one of a number of stereophonic broadcast signals recieved by the antenna 10, and a demodulating device for demodulating the selected stereophonic broadcast signal and thereby providing a stereophonic audio signal composed of left and right audio signals which are supplied to respective inputs 12L and 12R of an input signal selector 12. The input signal selector 12 is further shown to have auxiliary inputs 12XL and 12XR and auxiliary inputs 12YL and 12YR which are connected to respective auxiliary input terminals 13 to which left and right audio signals forming stereophonic audio signals are supplied from other audio signal sources, such as, various audio disk or tape players. Selected left and right audio signals SL and SR are obtained from the input signal selector 12 and supplied to preamplifiers 14 and 15, respectively.

The amplified left and right audio signals SL and SR are supplied from preamplifiers 14 and 15, respectively, through balance adjusters 16 and 17, respectively, to a volume controller 18. The balance adjusters 16 and 17 may be, as shown, constituted by respective variable resistors including resistive elements connected together, at one end, to ground, and having their other ends connected to the preamplifiers 14 and 15, respectively, and sliders which are independently adjustable along the resistive elements for providing to the volume controller 18 balance adjusted left and right audio signals with a desired relation of their levels to each other.

The volume controller 18 is shown to include a slidable variable resistor 19 for controlling the volume of the left audio signal SL and a slidable variable resistor 20 for controlling the volume of the right audio signal SR. The variable resistors 19 and 20 include respective resistive elements connected, at one end, to the sliders of the variable resistors forming the balance adjustors 16 and 17, respectively, while the other ends of the resistive elements of the variable resistors 19 and 20 are connected together to ground. The variable resistors 19 and 20 further include sliders movable along the respective resistive elements, and being both driven simultaneously by an actuator, for example, in the form of a motor 21. It will be appreciated that, in response to the operation of the motor 21, the sliders of the variable resistors 19 and 20 are slidably moved along the respective resistive elements so as to simultaneously increase or decrease the effective resistance values of the resistors 19 and 20, and thereby decrease or increase, respectively, the levels of the resulting left and right level-controlled audio signals SL' and SR', respectively, derived from the volume controller 18.

The level-controlled left and right audio signals SL' and SR' are supplied from volume controller 18 through power amplifiers 22 and 23 to sound reproducers or speakers 24 and 25, respectively. Thus, the speakers 24 and 25 produce sound outputs in accordance with the level-controlled left and right audio signals SL' and SR'.

All of the above described elements from the tuning and demodulating unit 11 to the speakers 24 and 25 are hereinafter referred to as constituting an audio signal processing circuit 30, which is provided with an operation controlling circuit 40. The operation controlling circuit 40 is shown to include a control unit 41 which may be constituted by a microcomputer, a timer 42 and a memory 43 each operatively coupled with the control unit 41, and a drive signal generator 44 connected with the motor 21. The control unit 41 is operative to produce a tuning control signal Ct which is supplied to the tuning and demodulating unit 11 for determining the broadcast signal which is to be selected, a motor control signal Cm which is supplied to the drive signal generator 44, and a plurality of operation control signals Cx which are supplied to various portions of the audio signal processing circuit 30 for causing the latter to be selectively operative and inoperative and for effecting other controls thereof. The drive signal generator 44 responds to the motor control signal Cm for producing a corresponding drive signal Dm which is supplied to the motor 21.

A remote control signal receiver 45 which is provided at the outside of a block or housing containing the operation control circuit 40, and an alarm setting switch 46 are also shown to be connected with the control unit 41. The remote control signal receiver 45 is operative to receive a remote control signal Cr, radiated or transmitted from a remote commander 47, and converts such remote control signal Cr into corresponding electrical signals supplied to the control unit 41. The remote commander 47 has a power control push-button switch 48, volume control push-button switches 49, and push-button switches forming a key-pad 50 and which are used for tuning control, time setting and the remote control of other operations. The remote commander 47 is operative, in response to the selective actuation of one or more of the push-button switches 48, 49 and 50, to transmit the remote control signal Cr in the form of corresponding demodulated infra red signals which are sensed by the receiver 45. Further, when the alarm setting switch 46 is actuated or turned ON, the control unit 41 causes the sound reproducing apparatus to perform its alarm function, as hereinafter described in detail.

It will be appreciated that, in using the above described sound reproducing apparatus according to the embodiment of this invention shown on FIG. 1, the power control push-button switch 48 of the remote commander 47 is first actuated so that the corresponding remote control signal Cr, when received by the remote control signal receiver 45, causes the control unit 41 to provide the operation control signals Cx by which the audio signal processing circuit 30 is made operative. Then, selective actuation of the push-button switches of the key-pad 50 is performed for exercising tuning control, and the resulting remote control signal from commander 47 is converted by receiver 45 into electrical signals which cause the control unit 45 to provide a suitable tuning control signal Ct by which the tuning and demodulating unit 11 is made to select and demodulate the desired one of the stereophonic broadcast signals received by the antenna 10. With the input signal selector 12 being conditioned for connection to its inputs 12L and 12R, the left and right audio signals SL and SR obtained from the tuning and demodulating unit 11 are passed through the selector 12 to the preamplifiers 14 and 15, respectively. The preamplified left audio signal from the preamplifier 14 is supplied through the balance adjuster 16 to the slidable variable resistor 19 in the volume controller 18, and the resulting level controlled left audio signal SL' is supplied through the power amplifier 22 to the speaker 24. Similarly, the preamplified right audio signal SR is supplied from the preamplifier 15 through the balance adjuster 17 to the slidable variable resistor 20 in the volume controller 18, and the resulting level controlled right audio signal SR' is supplied through the power amplifier 23 to the speaker 25. Thus, reproduced sounds based on the level-controlled left and right audio signals SL' and SR' are obtained from the speakers 24 and 25, respectively.

When one or the other of the volume control push-button switches 49 of the remote commander 47 is actuated, the resulting remote control signal Cr is converted by the receiver 45 into electrical signals which cause the control unit 41 to supply a corresponding motor control signal Cm to the drive signal generator 44. In response to the motor control signal Cm, the drive signal generator 44 provides a corresponding drive signal Dm to the motor 21 for operating the same. As a result of such operation of the motor 21, the sliders of the variable resistors 19 and 20 in the volume controller 18 are simultaneously driven to correspondingly vary the effective resistance values of the variable resistors 19 and 20, with the result that the volumes of the sounds output by the speakers 24 and 25 are correspondingly increased or decreased. Thus, during the normal operation of the sound reproducing apparatus embodying this invention, the volume of the reproduced sound can be varied at will merely by selective actuation of the volume control push-button switches 49 of the remote commander 47. If the sound reproducing apparatus is operated when a person is retiring, the volume of the sound may be reduced for inducing sleep, and, thereafter, the sound reproducing apparatus may be automatically rendered inoperative. However, such reduced volume of the reproduced sound may not be sufficient to ensure that a sleeping person will be awakened thereby if the sound reproducing apparatus is again made operative at a preset time so as to function as an alarm.

Therefore, in accordance with the present invention, the volume of the sounds emanating from the speakers 24 and 25 is automatically controlled to ensure that such sounds will be sufficient to awaken a sleeping person when performing the alarm function of the apparatus, that is, when the apparatus is made operative at a preset time and its alarm function has been selected. Prior to performance of the alarm function, time setting and sound volume setting operations are carried out independently of each other.

When performing the time setting operation, the pushbutton switches of the key-pad 50 of the remote commander 47 are selectively actuated according to the time to be set and, in response thereto, the remote control signal Cr representing such preset time is radiated or transmitted from the remote commander 47 to the remote control signal receiver 45. The resulting electrical signals supplied from the receiver 45 to the control unit 41 establish the time setting mode of the latter in which the control unit 41 operates to store in the memory 43 data corresponding to the preset time represented by the remote control signal Cr. Such present time data stored in the memory 43 are compared with output data obtained from a continuously operating timer (not shown) included in the control unit 41.

For performing a sound volume setting operation, the alarm setting switch 46 is depressed or turned ON for at least a predetermined period of time, for example, for at least 2 seconds, as measured by the timer 42, while the speakers 24 and 25 emit respective sounds at an ordinary or normal volume, and with the control unit 41 continuing to operate in its time setting mode. During the time in which the control unit 41 remains in its time setting mode, one of the volume control pushbutton switches 49 of the remote commander 47 is actuated so as to cause an increase in the volume of the sound outputs from the speakers 24 and 25. So long as one of the volume control pushbutton switches 49 is actuated for increasing the volume of the sound outputs from the speakers 24 and 25, the remote control signal Cr transmitted from the commander 47 to the receiver 45 is in the form of a volume control signal Cra. The control unit 41, in its time setting mode, provides data corresponding to the duration of the period of time in which the volume control signal Cra is transmitted and, hence, in which the volume of the speaker outputs is being increased. When the volume of the sound produced by the speakers 24 and 25 has become sufficiently high in response to the continued actuation of the volume increasing push-button switch 49, the alarm setting switch 46 is again turned ON and, in response thereto, the control unit 41 operates to store in the memory 43 the data corresponding to the duration of the time in which the volume control signal Cra was transmitted for increasing the volume. Upon the storing of such duration indicating data in the memory 43, a new sound volume setting has been effected.

If neither of the volume control push-button switches 49 is actuated within a predetermined period of time, for example, within 5 seconds as measured by the timer 42, after the time setting mode of the control unit 41 has been established, or if the alarm setting switch 46 is not turned ON after one of the volume control push-button switches 49 has been actuated, the control unit 41 is released from its time setting mode and a sound volume setting is not performed, that is, data corresponding to the duration of actuation of one or the other of the switches 49 is not stored in the memory 43.

After a sound volume setting operation has been completed, the control unit 41 changes-over to its alarm mode for performing the operations required for its alarm function Similarly, if the alarm setting switch 46 is depressed or turned ON for a period of time shorter than 2 seconds at a time when a sound volume setting has not been newly effected, the control unit 41 is again changed-over to its alarm mode.

In performing the alarm function with the control unit 41 in its alarm mode after a time setting operation and a sound volume setting operation have been carried out as described above, the operation control signals Cx are supplied from the control unit 41 to the various portions of the audio signal processing circuit 30 to cause the latter to be operative when the current time data obtained from the timer (not shown) within the control unit 41 come to coincide with the data stored in the memory 43 for representing the preset time. Simultaneously with such commencement of the operation of the audio signal processing circuit 30 at the preset time, the motor control signal Cm is supplied from the control unit 41 to the drive signal generator 44 for a period of time represented by the set duration data stored in the memory 43. In response to such signal Cm, the drive signal generator 44 produces the drive signal Dm and supplies the same to the motor 21 for the set duration during which the motor 21 is operated. Consequently, the sliders of the variable resistors 19 and 20 in the volume controller 18 are driven by the motor 21 for a period of time corresponding to the set duration so as to change the effective resistance values of the resistors 19 and 20 in a sense for increasing the volume of the sounds produced by the speakers 24 and 25. It will be appreciated that the extent of such increase in the volume of the produced sounds corresponds to the duration during which the motor 21 is operated in response to the drive signal Dm, and hence in response to the set duration indicating data previously stored in the memory 43.

Therefore, in the manner described above, sounds of predetermined increased volume are obtained from the speakers 24 and 25 after the preset time at which the audio signal processing circuit is made operative so that the sounds of increased volume will be an effective alarm for rousing a sleeping person.

Figure 2:
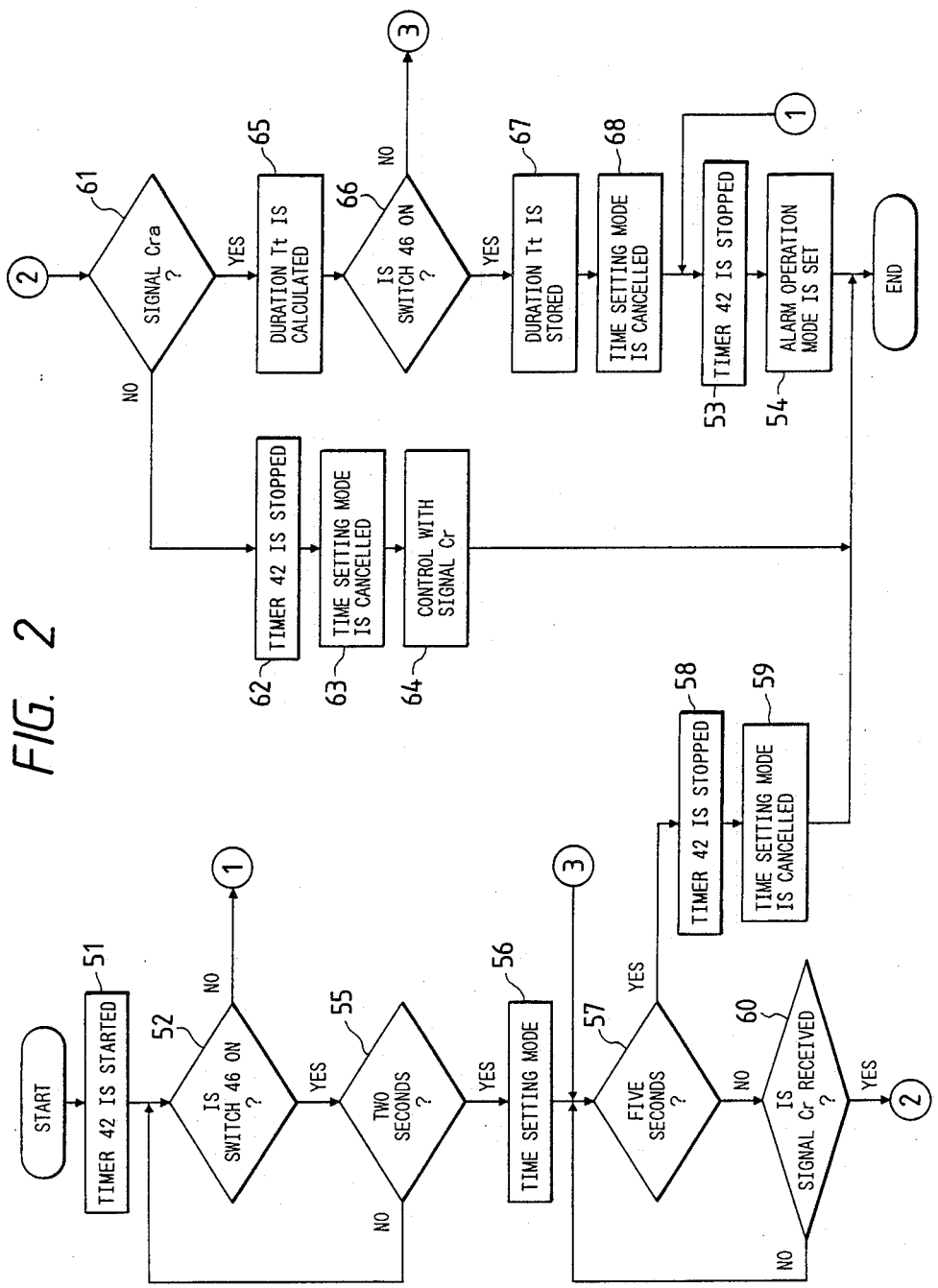
FIG. 2 is a flow chart showing a sequence of steps or operations performed by the apparatus of FIG. 1 in accordance with a program established by a microcomputer included therein when setting a desired volume of the sound to be reproduced.

The program carried out by the microcomputer constituting the control unit 41 for performing a sound volume setting operation with the apparatus of FIG. 1, will now be further described with reference to the flow chart of FIG. 2. As shown on FIG. 2, the program is initiated or started in response to turning ON of the alarm setting switch 46 whereupon, in step 51, operation of the timer 42 is commenced. In the next step 52 it is determined whether the alarm setting switch 46 is turned ON for a substantial interval of time or merely momentarily. In other words, if the alarm setting switch 46 has been only turned ON momentarily, the answer to the query in decision step 52 is NO and the program advances to step 53 in which the operation of the timer 42 is halted. In the following step 54, the alarm mode of the control unit 41 is established and, thereafter, the sound volume setting program is terminated On the other hand, if it is determined in step 52 that the alarm setting switch 46 has been more than momentarily depressed or turned ON, the program proceeds to step 55 in which it is determined whether or not 2 seconds have elapsed since the alarm setting switch 46 was initially turned ON. If 2 seconds have not elapsed since the alarm setting switch 46 was turned ON, the program is returned to step 52. On the other hand, if the alarm setting switch 46 has been turned ON for at least 2 seconds, the time setting mode of the control unit 41 is established in step 56. Then, in step 57, it is determined with reference to data obtained from the timer 42, whether or not 5 seconds have elapsed since the time setting mode of the control unit 41 has been established. If 5 seconds have elapsed since the time setting mode of the control unit 41 was established, the operation of the timer 42 is halted in step 58, and the control unit 41 is released from its time setting mode in the following step 59, whereupon the sound volume setting program is terminated.

On the other hand, if it is determined in step 57 that 5 seconds have not yet elapsed since the time setting mode of the control unit 41 was established, the program proceeds to step 60 where it is checked whether or not the remote control signal Cr is being received by the remote control signal receiver 45. If the remote control signal Cr is not being received, the program is returned to step 57. On the other hand, if it is determined in step 60 that the remote control signal Cr is being received by the remote control signal receiver 45, the program proceeds to step 61 in which it is determined whether or not the received remote control signal is a volume control signal Cra, as results when one of the volume control push-button switches 49 is depressed or actuated.

If it is determined in step 61 that the remote control signal Cr transmitted to receiver 45 is not a volume control signal Cra, operation of the timer 42 is halted in step 62 and the control unit 41 is released from its time setting mode in step 63, whereupon the control operation corresponding to the remote control signal Cr which is being transmitted to the receiver 45 is carried out in step 64. Thereafter, the sound volume setting program is terminated.

On the other hand, if it is determined in step 61 that the remote control signal Cr being transmitted to the receiver 45 is in fact a volume control signal Cra, the duration Tt of the period of time during which the volume control signal Cra has been transmitted is calculated in step 65 and data corresponding to such duration Tt is provided. In the next step 66, it is determined whether or not the alarm setting switch 46 has been again depressed or turned ON. If the alarm setting switch 46 is not again turned ON, the program returns to step 57. On the other hand, if it is determined in step 66 that the alarm setting switch 46 is again turned ON, the data representing the duration Tt calculated in step 65 are stored in the memory 43 in the following step 67. In the next step 68, the control unit 41 is released from its time setting mode and the program proceeds to step 53 in which the operation of the timer 42 is halted. Thereafter, in step 54, the alarm mode of the control unit 41 is established, and then the sound volume setting program is terminated.

Figure 3:
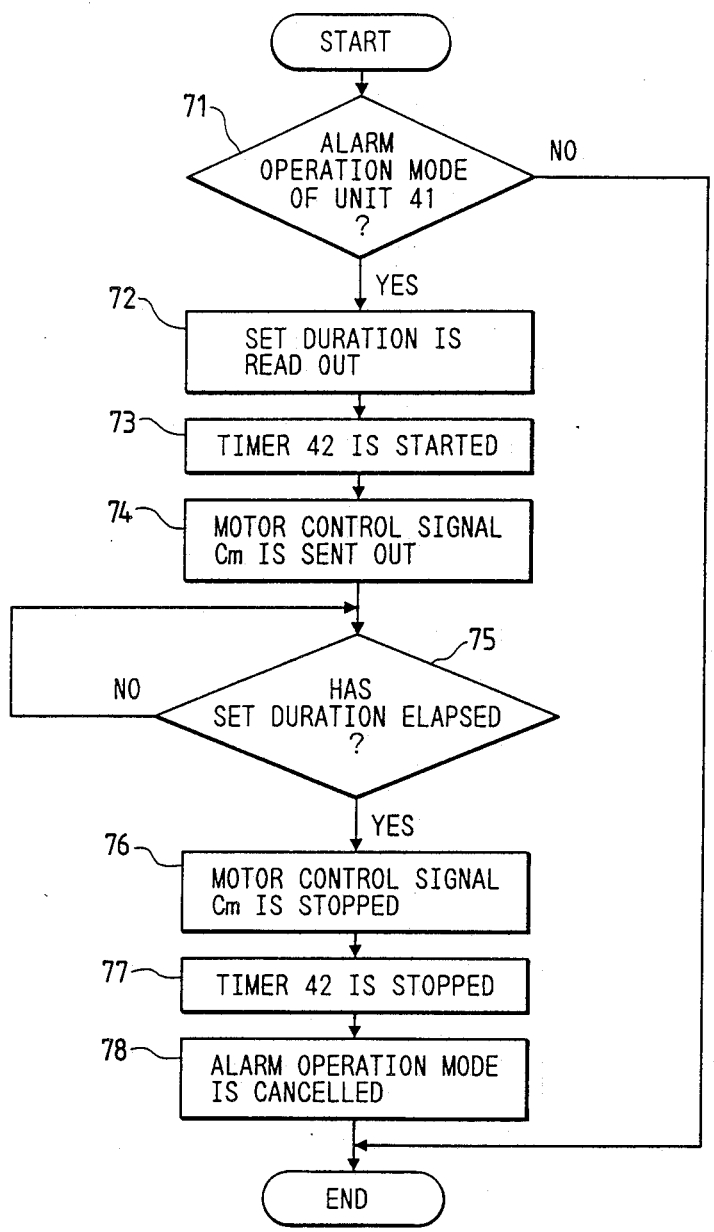
FIG. 3 is a flow chart showing a sequence of steps or operations performed by the apparatus of FIG. 1 in accordance with a program established by the microcomputer when the apparatus is performing an alarm function.

Referring now to FIG. 3, it will be seen that a program carried out in the microcomputer constituting the control unit 41 for performing the alarm function of the sound reproducing apparatus illustrated in FIG. 1 is started at the preset time corresponding to data stored in the memory 43. At such preset time operation control signals Cx are supplied from the control unit 41 to the various parts of the audio signal processing circuit 30 for causing the latter to become operative. After initiation of the program for performing the alarm function, it is determined in step 71 whether or not the alarm mode of the control unit 41 has been established. If the control unit 41 is not in its alarm mode, the program is terminated. On the other hand, if it is determined in step 71 that the control unit 41 is in its alarm mode, the data representing the duration Tt are read from the memory 43 in the following step 72. In the next step 73 the operation of the timer 42 is initiated and, substantially simultaneously therewith, in step 74, the motor control signal Cm is supplied from control unit 41 to the drive signal generator 44 for causing the latter to provide the drive signal Dm by which the motor 21 is operated Thereafter, in step 75, the set duration corresponding to the data read from the memory 43 is compared with the elapsed time indicated by the timer 42 for determining whether or not the set duration Tt has elapsed since commencement of the operation of the motor 21. So long as the set duration Tt has not elapsed, step 75 is repeated. However, when it is determined, in step 75, that the set duration Tt has elapsed, the program proceeds to step 76 in which the motor control signal Cm is terminated. Then, in succession, the operation of the timer 42 is halted in step 77 and the control unit 41 is released from its alarm mode in step 78, whereupon the program for performing an alarm operation is terminated. It will be appreciated that during the period of time corresponding to the duration Tt in which the motor control signal Cm is supplied to the drive signal generator 44 for operating the motor 21, the variable resistors 19 and 20 in the volume controller 18 have their effective resistance values changed so as to increase the volume of the sounds produced by the speakers 24 and 25 to the extent previously selected during the sound volume setting operation previously described with reference to the flow chart of FIG. 2.

Figure 4:
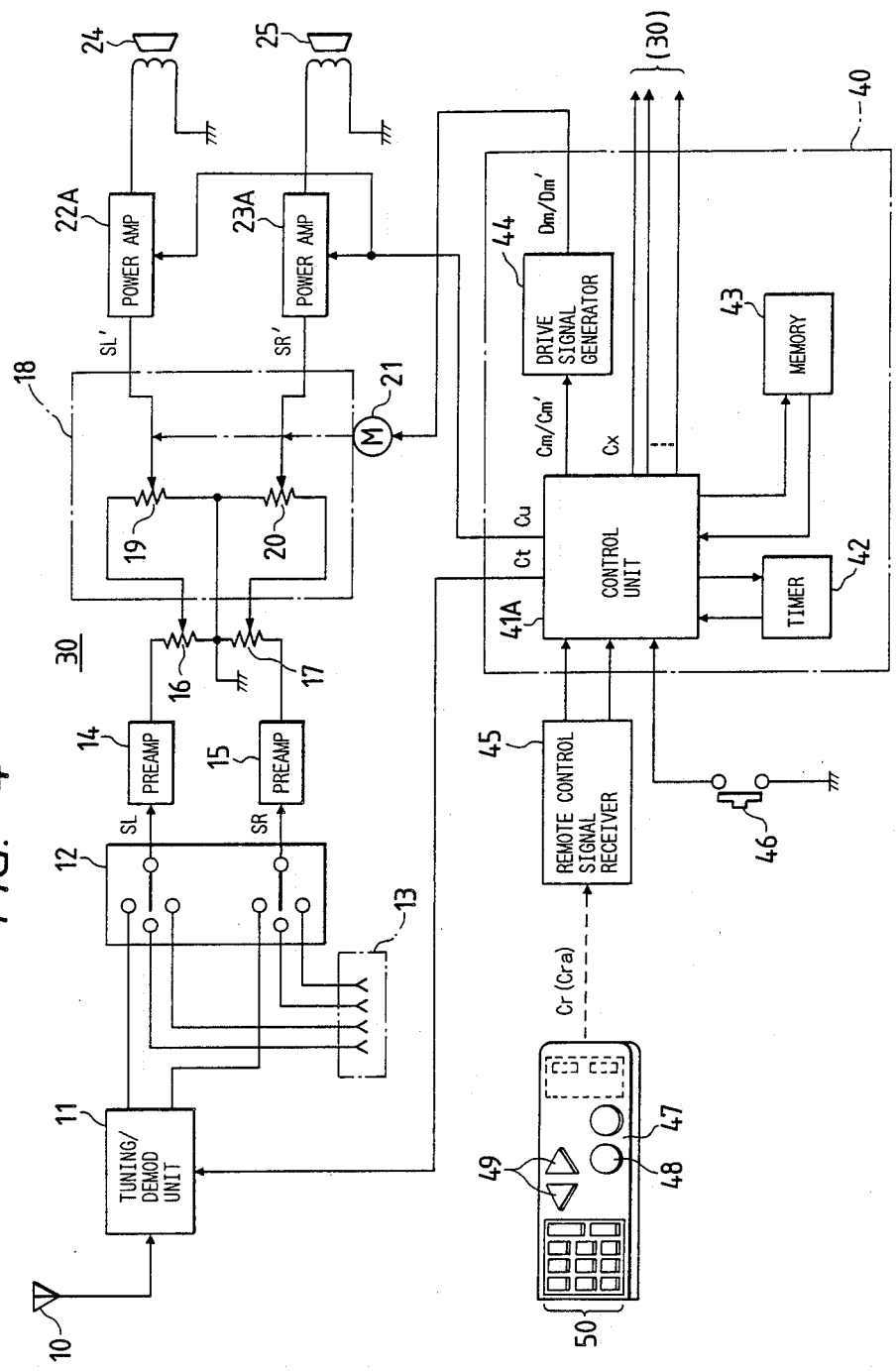
FIG. 4 is a schematic block diagram showing a sound reproducing apparatus according to another embodiment of the present invention.

Referring now to FIG. 4, it will be seen that a sound reproducing apparatus according to another embodiment of the present invention is there shown to also be in the form of a stereophonic broadcast signal receiver similar to that described above with reference to FIG. 1, and in which devices, circuits and components corresponding to those described with reference to FIG. 1 are identified by the same reference numerals and will not be further described herein.

In the embodiment of FIG. 4, the control unit 41A, which again may be desirably constituted by a microcomputer, is additionally operative at appropriate times, as hereinafter further described, to supply a muting control signal Cu to each of the power amplifiers 22A and 23A for muting the output from such power amplifiers to the loud speakers 24 and 25, and further to selectively supply motor control signals Cm and Cm' to the drive signal generator 44 for causing the latter to produce drive signals Dm and Dm', respectively, by which the motor 21 is driven in opposite directions for increasing and decreasing, respectively, the volume of the sound produced by the speakers 24 and 25.

The sound reproducing apparatus of FIG. 4 operates generally in the same manner as described above with reference to the apparatus of FIG. 1 apart from its performance of the alarm function under the control of the control unit 41A. More specifically, after the time setting and sound volume operations have been carried out in the manner described above for the embodiment of FIG. 1, the alarm mode of the control unit 41A is similarly established and operation control signals Cx are supplied from the control unit 41A to the various portions of the audio signal processing circuit 30 for causing operation of the latter when data obtained from a time (not shown) container in the control unit 41A coincide with the data stored in the memory 43 for indicating the preset time at which an alarm operation is to be performed. Simultaneously with the commencement of operation of the audio signal processing circuit 30, the control unit 41A supplies the muting control signal Cu to each of the power amplifiers 22A and 23A so that no sound output is obtained from the speakers 24 and 25. At the same time, the motor control signal Cm' is supplied from the control unit 41A to the drive signal generator 44 so that the latter produces the drive signal Dm' by which the motor 21 is driven in the direction to change the effective resistance values of the variable resistors 19 and 20 toward one end, for example, the upper or maximum end, of the range of effective resistance values of the variable resistors 19 and 20.

After the variable resistors 19 and 20 have been driven to provide their maximum effective resistance values, which correspond to a minimum volume of sound produced by the speakers 24 and 25, the motor control signal Cm is supplied from the control unit 41 to the drive signal generator 44 which, in response thereto, produces the drive signal Dm for operating the motor 21 in the opposite direction, that is, in the direction for reduced the effective resistance values of the resistors 19 and 20. Such drive signal Dm is supplied to the motor 21 for a set duration which is established by a sound volume setting operation, as described in connection with the embodiment of the invention shown on FIG. 1 Consequently, the variable resistors 19 and 20 are driven for the set duration so a to decrease the effective resistance values thereof starting from their maximum effective resistance values so that the sound outputs of the speakers 24 and 25 are increased to a predetermined constant volume. The predetermined constant volume to which the sound outputs of the speakers 24 and 25 are increased is sufficient to ensure that, when the audio signal processing circuit 30 is made operative at a set time, the sound produced by the speakers 24 and 25 in accordance with the left and right audio signals SL and SR will be of sufficient loudness to awaken a sleeping person, and thereby serve as an alarm, even if the last preceding use of the sound reproducing apparatus had employed relatively low sound volumes, for example, for inducing sleep.

The program carried out by the microcomputer constituting the control unit 41A for readying the sound reproducing apparatus of FIG. 4 for its alarm operation will now be described with reference to the flow chart of FIG. 5. As shown on FIG. 5, the program is initiates or started in response to the supplying of the operation control signals Cx from the control unit 41A to the various parts of the audio signal processing circuit 30 for causing operation of the latter at the set time. Upon such starting of the processor, it is determined, in step 81, whether or not the control unit 41A is in its alarm operation mode. If the control unit 41 is not in its alarm operation mode, the program for readying the sound reproducing apparatus for its alarm operation is terminated. On the other hand, if the control unit 41A is determined to be in its alarm operation mode, the program proceeds to step 82 in which the muting control signal Cu is supplied from the control unit 41A to the power amplifiers 22A and 23A for causing the cuting of the outputs therefrom to the respective speakers 24 and 25. In the following step 83, operation of the timer 42 is commenced and then, in step 84, the motor control signal Cm' is supplied from the control unit 41A to the drive signal generator 44. The program then proceeds to step 85 in which it is determined, with reference to the timer 42, whether or not is seconds have elapsed since commencement of the supplying of the motor control signal Cm' to the drive signal generator 44. If 10 seconds have not elapsed, step 85 is repeated. On the other hand, if it is determined that 10 seconds have elapsed since commencement of the signal Cm', the supplying of such signal to the drive signal generator 44 is halted in step 86. It should be noted that, in the 10 second interval during which the motor control signal Cm' is supplied to the drive signal generator 44, the drive signal Dm' supplied to the motor 21 is operative to drive the variable resistors 19 and 20, from any positions they may have occupied, to positions corresponding to their maximum effective resistance values.

After the motor control signal Cm' has been halted in step 86, the operation of the timer 42 is halted in step 87 and then, in step 88, the supplying of the muting control signal Cu to the power amplifier 22 and 23 is also halted. In the next step 89, the data corresponding to the set duration of the period in which the motor control signal Cm is to be supplied are read out of the memory 43.

Then, operation of the timer 42 is started again in step 90 and, in the following step 91, the motor control signal Cm is supplied to the drive signal generator 44 which, in response thereto, supplies the drive signal Dm to the motor 21 for driving variable resistors 19 and 20 in the direction for decreasing their effective resistance values from the previously established maximum effective resistance values, thereby increasing the volumes of the sounds produced by the speakers 24 and 25. In the next step 92, it is determined, with reference to data from the timer 42, whether a period of time corresponding to the set duration read from the memory 43 in step 89 has elapsed since supplying of the motor control signal Cm has been commenced in step 91. If such set duration has not yet elapsed, step 92 is repeated. On the other hand when it is determined in step 92 that the motor control signal Cm has been supplied from the control unit 41 for the set duration, the supplying of the motor control signal Cm is halted in step 93.

By means of the above described operations through step 93, each of the variable resistors 19 and 20 in the volume controller 18 has been adjusted by the motor 21 so as to ensure that the sound produced by the speakers 24 and 25 has a predetermined constant volume. Thereafter, operation of the timer 42 is halted in step 94 and the control unit 41A is released from its alarm operation mode in step 95 which leads to termination of the program for the alarm operation.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope of spirit of the invention as defined in the appended claims.

What is claimed is:

1. A sound reproducing apparatus comprising:
audio signal input means;
sound producing means for generating sound in response to the application of an audio signal thereto;
audio signal processing means operative to receive an audio signal from said input means and including variable resistance means through which the received audio signal is applied to said sound producing means, and actuator means for said variable resistance means operable by a drive signal for varying an effective resistance value of said resistance means and thereby changing the volume of the sound generated by said sound producing means;
time control means for causing said audio signal processing means to automatically commence operation at a preset time;
duration setting means including memory means, means operable in response to a duration setting signal to store in said memory means data corresponding to a selected duration of operation of said actuator means, and generating means for generating said drive signal to operate said actuator means; and
control means programmed to be operative, when said time control means causes the commencement of operation of said audio signal processing means at said preset time, to apply said drive signal from said generating means to said actuator means for said selected duration corresponding to said data stored in the memory means so as to determine said volume of the sound from said sound producing means at the end of said duration.

2. A sound reproducing apparatus according to claim 1; wherein said variable resistance means includes at least one sliding variable resistor.

3. A sound reproducing apparatus according to claim 2; wherein said actuator means includes a motor mechanically connected with said sliding variable resistor.

4. A sound reproducing apparatus according to claim 1; wherein said variable resistance means includes a plurality of sliding variable resistors driven simultaneously by said actuator means.

5. A sound reproducing apparatus according to claim 1; further comprising remote control means for providing said duration setting signal in the form of a remote control signal; and in which said duration setting means includes receiving means for receiving said remote control signal.

6. A sound reproducing apparatus according to claim 1; wherein said variable resistance means has a range of effective resistance values; and
wherein said control means is further programmed to cause said variable resistance means to have an effective resistance value at one end of said range thereof when said audio signal processing means is made to commence operation by said time control means, and before said drive signal is applied to the actuator means for said selected duration corresponding to the data stored in said memory means.

7. A sound reproducing apparatus according to claim 6; wherein said control means is operative to apply another drive signal to said actuator means so as to cause the variable resistance means to have the effective resistance value at said one end of the range of effective resistance values.

8. A sound reproducing apparatus according to claim 7; wherein said one end of the range of effective resistance values is the upper end thereof.

9. A sound reproducing apparatus according to claim 6; wherein said variable resistance means includes at least one sliding variable resistor.

10. A sound reproducing apparatus according to claim 9; wherein said actuator means includes a motor mechanically connected with said sliding variable resistor.

11. A sound reproducing apparatus according to claim 6; wherein said variable resistance means includes a plurality of sliding variable resistors driven simultaneously by said actuator means.

12. A sound reproducing apparatus according to claim 6; further comprising remote control means for providing said duration setting signal in the form of a remote control signal; and in which said duration setting means includes receiving means for receiving said remote control signal.

13. A sound reproducing apparatus according to claim 1; wherein said audio signal processing means includes muting means operative for preventing application of the received audio signal to said sound producing means; and
wherein said control means is further programmed to operate said muting means when said audio signal processing means is made to commence operation by said time control means for a time before said drive signal is applied to the actuator means for said selected duration corresponding to the data stored in said memory means audio signal processing.

14. A sound reproducing apparatus according to claim 13; wherein said variable resistance means has a range of effective resistance values; and
wherein said control means is further programmed to cause said variable resistance means to have an effective resistance value at the upper end of said range thereof at the conclusion of said time during which said muting means is operated.

* * * * *